United States Patent [19]

Hatakeyama et al.

[11] Patent Number: 5,770,123
[45] Date of Patent: Jun. 23, 1998

[54] METHOD AND APPARATUS FOR ENERGY BEAM MACHINING

[75] Inventors: Masahiro Hatakeyama; Katsunori Ichiki, both of Kanagawa-ken; Tadasuke Kobata, Tokyo; Masayuki Nakao, Chiba-ken; Yotaro Hatamura, 2-12-11, Kohinata, Bunkyo-ku, Tokyo, all of Japan

[73] Assignees: Ebara Corporation; Yotaro Hatamura, both of Tokyo, Japan

[21] Appl. No.: 531,698

[22] Filed: Sep. 21, 1995

[30] Foreign Application Priority Data

Sep. 22, 1994 [JP] Japan ................................ 6-228235
Dec. 9, 1994 [JP] Japan ................................ 6-306496

[51] Int. Cl.⁶ .................................................. B29C 59/16
[52] U.S. Cl. .............................. 264/1.21; 65/61; 65/102; 219/121.6; 264/1.37; 264/2.7; 264/40.1; 264/101; 425/135; 425/173; 425/174.4
[58] Field of Search ................................ 264/1.21, 1.36, 264/1.37, 1.38, 2.7, 40.1, 101; 216/24, 26, 62, 63, 66, 67; 250/492.3, 442.11; 219/121.61, 121.66, 121.67, 121.6; 65/61, 102; 425/135, 173, 174.4

[56] References Cited

U.S. PATENT DOCUMENTS

| 3,548,189 | 12/1970 | Meinel et al. | 250/492.3 |
| 4,128,765 | 12/1978 | Franks | 250/442.11 |
| 4,307,046 | 12/1981 | Neefe | 264/1.37 |
| 4,503,329 | 3/1985 | Yamaguchi et al. | 250/309 |
| 4,842,782 | 6/1989 | Portney et al. | 264/1.38 |
| 5,286,338 | 2/1994 | Feldblum et al. | 216/26 |
| 5,618,474 | 4/1997 | Liau et al. | 264/1.36 |

OTHER PUBLICATIONS

Fusao Shimokawa et al., *Reactive-fast-atom Beam Etching of GaAs Using $Cl_2$ Gas,* Journal of Applied Physics, Sep. 15, 1989, pp. 2613–2618.

*Actual State of Integrated Circuit Technique* with English translation.

*The 71st JSME Spring Annual Meeting,* No. 940–10, Mar. 29, 1994 with English translation.

*Primary Examiner*—Mathieu D. Vargot
*Attorney, Agent, or Firm*—Wenderoth, Lind & Ponack

[57] ABSTRACT

An energy beam is irradiated to a workpiece through a beam transmission hole defined in a mask. At that time, a relative position between an energy beam source and the mask or the mask and the workpiece is changed, so that machining depth of the workpiece is varied depending on machining portions of the workpiece, which correspond to amounts of irradiation of the energy beam. With this method, a machined product having locally different depths very easily can be made and further the product can be machined to desired depths with high accuracy by a single machining operation in a short time.

34 Claims, 18 Drawing Sheets

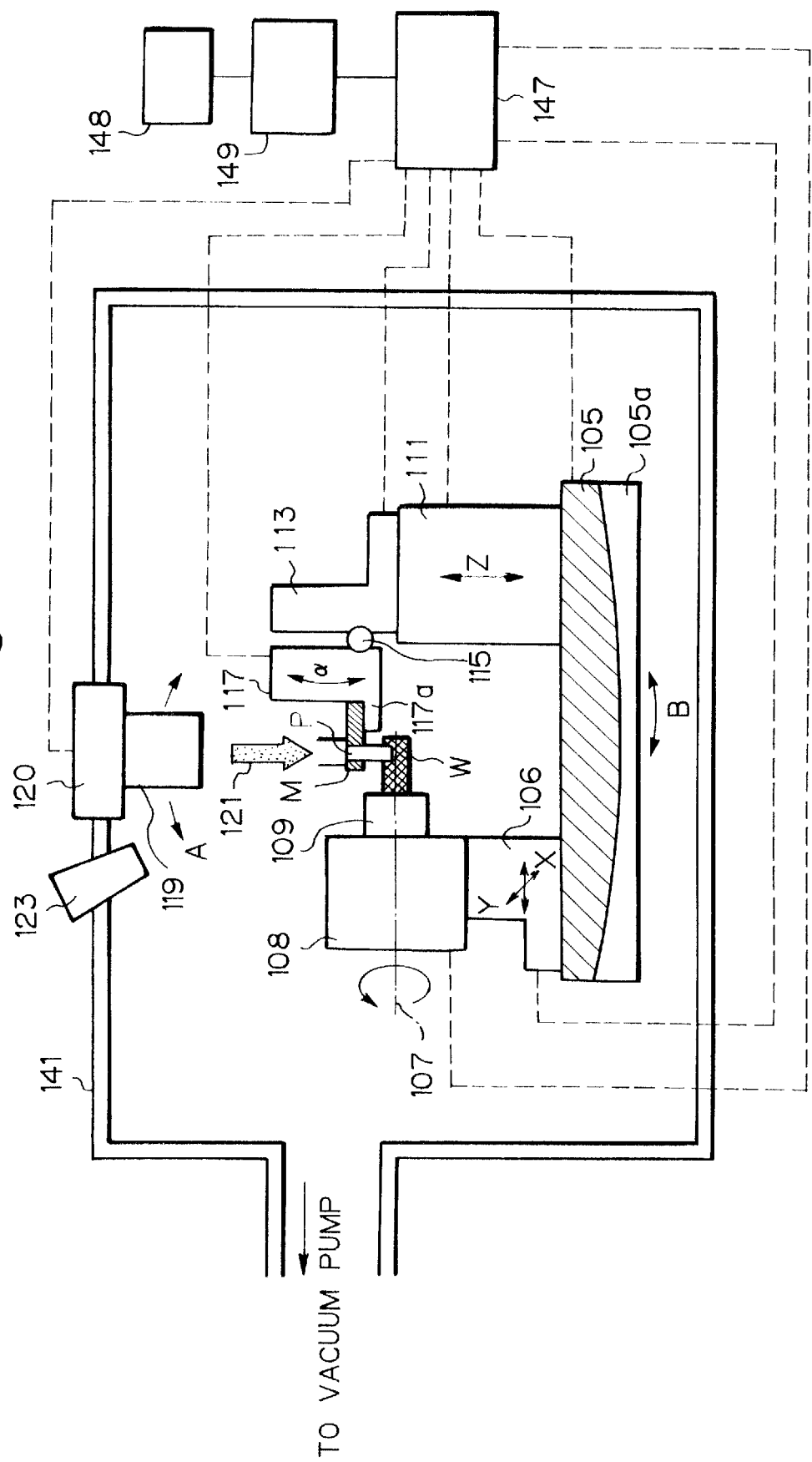

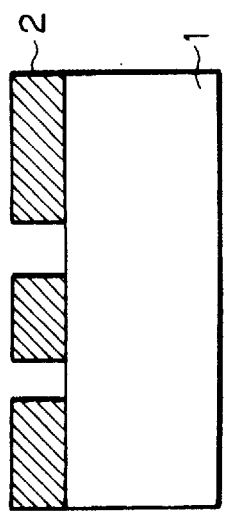
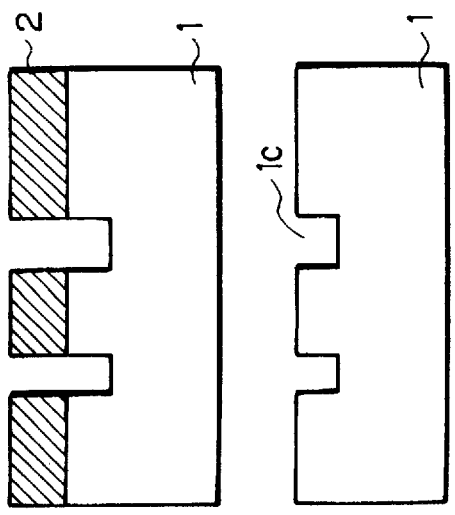
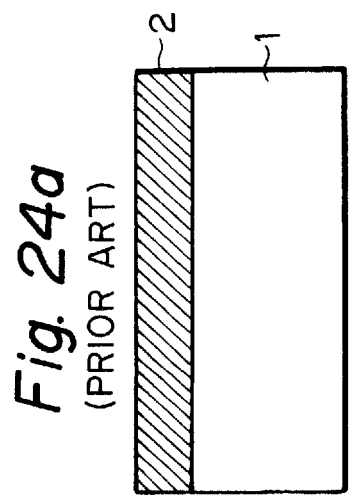
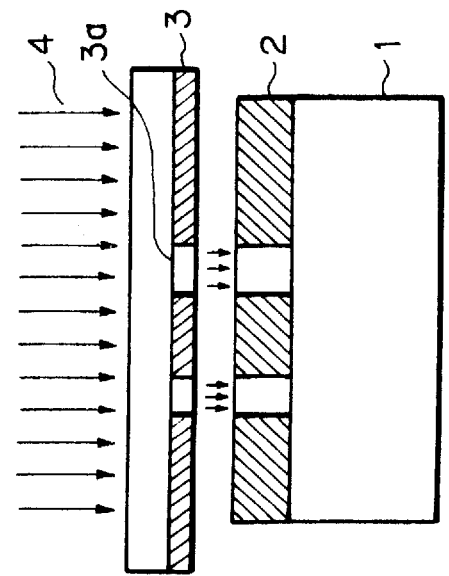

METHOD AND APPARATUS FOR ENERGY BEAM MACHINING

BACKGROUND OF THE INVENTION

1. Field of the Art

The present invention relates to a method and apparatus for energy beam machining which enables an arbitrary change in a machining depth by changing an amount of irradiation of a beam which is transmitted through a mask pattern for irradiating a workpiece.

The present invention also relates to the method and apparatus described above which enable effective positioning of a workpiece relative to a mask with high accuracy at the time of operation.

2. Prior Arts

Conventionally, a cutting tool, chemical reaction or a focusing beam are employed as a general machining technology for micro-cutting the surface of a workpiece in the manufacture of a microbody used for micromachines, medical instruments, information devices and the like. In particular, dry etching and wet etching making use of a resist are employed in micro-machining technology in the manufacture of semiconductors and the like.

FIGS. 24a–24e show an example of processes for micro-machining making use of a conventional resist. First, a resist material 2 is coated on a substrate 1 to be machined (FIG. 24a). A pattern hole 3a defined in the photomask 3 is transferred to the resist 2 by irradiating ultraviolet rays 4 through the photomask 3 (FIG. 24b). The portions of the resist material 2 to which the ultraviolet rays 4 are irradiated through the pattern hole 3a are removed by development (FIG. 24c). Anisotropic etching is effected on the substrate to be machined where no resist material exists making use of ions and/or radicals in a plasma (FIG. 24d) and finally the resist material 2 is removed (FIG. 24e). Micro-machining is carried out by forming a hole or holes having the same shape as that of the pattern hole or holes of the photomask on the surface of the substrate to be machined through the above processes. The manufacturing of a semiconductor device is usually carried out by repeating the above processes.

However, the above conventional machining method requires the employment of highly complex and time-consuming processes such as the coating of a resist material on the substrate, the formation of a resist pattern by exposure and development, baking and the like, and thus machining cannot be effectively carried out. Further, since a flat surface is uniformly machined by etching making use of ions and/or radicals in a plasma, it is difficult to machine a structure having portions which each have a different depth or a three-dimensional structure with high accuracy. Further, since a different device is used for each process and positioning is carried out in each process with pinpoint accuracy, much expenditure of time and cost is required.

Further, micro-spherical lenses having a diameter in the order of microns and the like also require micro-machining similar to the substrate 1 to be machined for a semiconductor device. When such a micro-spherical lens is made, there is conventionally employed a method of melting the extreme end of a bar-shaped glass member 5 by heating it with a burner 6 and dropping and cooling melted glass balls, as shown, for example, in FIG. 25. However, the micro-spherical lenses 7 made by this method do not have the required accuracy with respect to surface roughness and degree of spherical shape. To cope with this problem, the following method is sometimes employed. That is, a micro-spherical lens 7 having been cooled is placed on a polishing table 9 having a polishing agent 8 scattered thereon and pressed while a rotary disk 10 is rotated around its axis to polish the surface of the lens. However, improvements to the surface roughness and degree of spherical shape of the thus polished micro-spherical lens 7 are limited in this method and it is difficult to effectively manufacture a micro-spherical lens which satisfies given standards of quality for optical lenses.

Consequently, an object of the present invention is to provide a method and apparatus for machining with high accuracy and efficiency a workpiece to produce a product having a structure including portions of different machining depths or a three-dimensional structure.

Another object of the present invention is to provide the method and apparatus as stated above wherein positioning of the workpiece and the mask can be rapidly and accurately effected in the machining of the workpiece.

A further object of the present invention is to provide the method and apparatus as stated above wherein a microbody which requires three-dimensional machining with high accuracy, such as a micro-spherical lens, can easily and efficiently be made.

SUMMARY OF THE INVENTION

The present invention achieves the above objects by providing an energy beam machining method which comprises the steps of irradiating an energy beam emitted from an energy beam source to a workpiece through a beam transmission hole having a pattern of a predetermined shape and which is defined in a mask, changing at least one of a relative positional relationship between the energy beam source and the mask and a relative positional relationship between the mask and the workpiece so as to control an amount of irradiation of the energy beam to the workpiece to thereby change a machining depth depending on portions of the workpiece to be machined.

The mask or the workpiece may be rotated about an axis along a direction in which the energy beam is irradiated and a ratio of open area of the beam transmission hole may be gradually increased radially outwardly of a radius center to the axis.

Alternatively, the energy beam source may be swung while its speed is regularly changed during a swing cycle, with the workpiece being rotated about an axis parallel with a direction in which the energy beam is irradiated when the energy beam source is located at the center of the swing cycle.

Alternatively, the mask and the workpiece may be moved in parallel with each other while their speeds are regularly changed corresponding to a relative positional relationship therebetween and the workpiece is rotated about an axis which is perpendicular or oblique to a direction in which the energy beam is irradiated.

The energy beam source, the mask and the workpiece may be aligned in a vacuum by using a microscope.

The relative positional relationship between the mask and the workpiece may be determined by using a fine positioning apparatus while observing the mask and the workpiece through a microscope.

The present invention also achieves the above objects by providing an energy beam machining method comprising the steps of determining a relative positional relationship between a workpiece and a mask having a pattern hole of a predetermined shape by using a fine positioning apparatus while observing the workpiece and the mask through a microscope, and irradiating an energy beam to the workpiece through the pattern hole in the mask.

The relative positional relationship between the workpiece and the mask may be determined while observing the workpiece and the mask through the microscope from a plurality of directions.

The machining may be carried out while holding the workpiece and the mask on the fine positioning apparatus.

The relative positional relationship between the workpiece and the mask may be determined in advance by the fine positioning apparatus while observing the workpiece and the mask through the microscope, and the machining is carried out in a state where the relative positional relationship between the workpiece and the mask is fixed by a fixture.

The fine positioning apparatus may be positioned in a vacuum vessel and the positioning may be carried out from outside the vacuum vessel.

The present invention further achieves the above objects by providing an energy beam machining apparatus which comprises an energy beam source for emitting an energy beam, a mask having a beam transmission hole having a pattern of a predetermined shape for allowing the energy beam to pass through the beam transmission hole, a workpiece to be machined by irradiation of the energy beam having passed through the mask, and control means for changing at least one of a relative positional relationship between the energy beam source and the mask and relative positional relationship between the mask and the workpiece so as to control an amount of irradiation of the energy beam irradiated to the workpiece to thereby change machining depth of the workpiece depending on portions of the workpiece to be machined.

The control means may be arranged so as to change the relative positional relationship between the energy beam source and the mask, and the apparatus may further comprise a microscope for observing the relative positional relationship between the workpiece and the mask, and a fine positioning apparatus for determining a relative position between the workpiece and the mask.

The apparatus may further comprise a fixture for holding the relative positional relationship between the workpiece and the mask which is determined by the fine positioning apparatus.

According to the present invention, since conventional complex resist coating and pattern forming processes are not necessary and positioning of a workpiece relative to a mask can be promptly carried out, the workpiece can be effectively machined.

In addition, according to the present invention, an energy beam is irradiated to a workpiece through the beam transmission hole defined in the mask and an amount of irradiation of the energy beam may be changed according to machining portions by changing a relative position between the energy beam source and the mask or between the mask and the workpiece so that the machining depth of the workpiece can be varied according to the portions of the workpiece to be machined.

In such a case, when a pattern is machined by irradiating an energy beam to a workpiece through a mask having a pattern hole defined therein, if the pattern is a micro-pattern having a size of 1 mm or less or the workpiece is a micro-body, it is difficult to carry out positioning without the use of a fine positioning apparatus and a microscope.

However, according to the present invention, since fine positioning may be carried out by a fine positioning apparatus while observing the workpiece and the mask through a microscope and the workpiece is machined by an energy beam while holding the position of the workpiece and the mask by the positioning apparatus or a fixture, a fine pattern can be machined with high accuracy.

Further, when positioning is carried out in a vacuum, since it is not necessary to expose the workpiece and the mask to the atmosphere, machining continuity can be maintained. As a result, not only can machining be effectively carried out but also positional dislocation among the workpiece, the mask and concerned devices can be prevented, which would otherwise be caused by a shift in machining position, whereby machining can be carried out with high accuracy. Further, there are no problems relating to oxidation of the machining surface of the workpiece.

The above and other objects, features and advantages of the present invention will become more apparent from the following description when taken in conjunction with the accompanying drawings in which preferred embodiments of the present invention are shown by way of illustrative examples.

BRIEF DESCRIPTION OF THE DRAWINGS

FIG. 13a is an enlarged plan view of a detail of FIG. 13, FIG. 14a is an enlarged plan view of a detail of FIG. 14, FIG. 23 is a schematic side elevational view showing another example of an apparatus used in a still further method of the present invention, FIGS. 24a–24e are process views showing an example of a substrate machining method making use of a conventional photolithography technology.

PREFERRED EMBODIMENTS OF THE INVENTION

Figure 1:
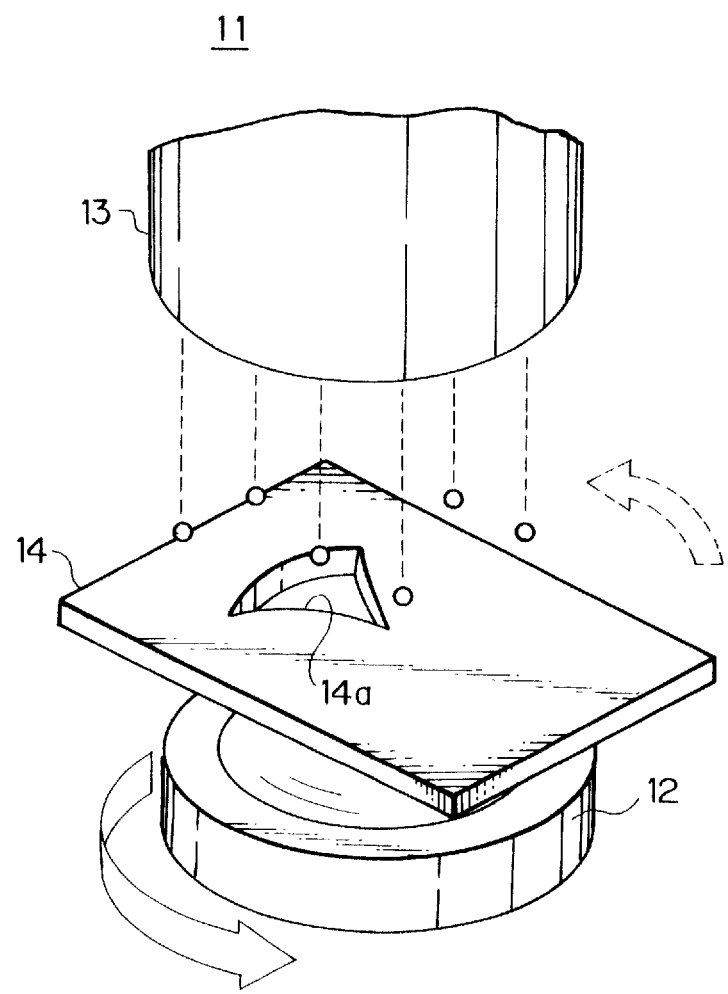
FIG. 1 is a schematic perspective view showing a first embodiment of an energy beam machining apparatus to which an energy beam machining method of the present invention is applied.
Figure 2:
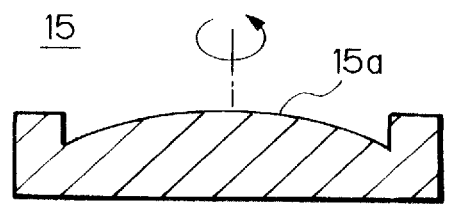
FIG. 2 is a longitudinal cross sectional view of a workpiece to explain a shape machined by the energy beam machining apparatus shown in FIG. 1.

Embodiments of the present invention will be described below with reference to FIGS. 1 to 12. FIG. 1 is a schematic perspective view showing a first embodiment of an energy beam machining apparatus to which an energy beam machining method of the present invention is applied, and FIG. 2 is a longitudinal cross sectional view of a workpiece illustrating a shape machined by the energy beam machining apparatus shown in FIG. 1.

An energy beam machining apparatus 11 shown in FIG. 1 is an apparatus for energy beam machining the surface of a disk-shaped workpiece 12 to be machined, which is composed of a metal material, glass material or the like, to a convex shape and an energy beam is irradiated downward from an energy beam source 13 as a beam having a uniform density. The workpiece 12 is coaxially disposed with respect to a beam axis passing through the center of a beam spot of the energy beam forming a circular spot and is driven in rotation at a constant speed about its center axis. Further, a mask 14 is interposed between the energy beam source 13 and the workpiece 12 to periodically change an irradiation pattern on the workpiece. An amount or portion of the beam to be irradiated to a specific region of the workpiece 12 is controlled by a beam transmission hole 14a defined in the mask 14 and having a ginkgo nut shape thus forming a shaped energy beam having a shape or cross section corresponding to the shape of hole 14a.

The position of the pivot or inner apex of the ginkgo nut shape of the beam transmission hole 14a is caused to coincide with the beam axis, i.e., the center of rotation of the workpiece 12, and the beam transmission hole 14a is shaped so that left and right lateral edges expand from the pivot or apex in curved shapes. Consequently, a rate of change of the open area of the beam transmission hole 14a is gradually increased in a radially outward direction and an amount of irradiation of the beam on the workpiece is increased radially outwardly from the center of rotation of the workpiece 12. Therefore, when the workpiece 12 rotates about its axis of rotation, a machining depth is gradually increased in a radially outward direction by an amount of irradiation of the energy beam per unit time which is increased in the radial direction, and finally a machined product 15 having a spherically convex surface 15a shown in FIG. 2 can be obtained.

Although, in the foregoing embodiment, the workpiece 12 is rotated about its center axis, the mask 14 may be rotated about the axis instead of the workpiece as shown by the dotted line arrow in FIG. 1.

In addition, although only the workpiece 12 is rotated about its axis in the above first embodiment, the energy beam source 13 can be swung or pivoted in synchronism with the rotation of the workpiece. For example, by providing a certain angle between the beam axis and the center of rotation of the workpiece, an amount of irradiation of the energy beam can be controlled in the radial direction from the center axis of rotation of the workpiece with respect to the surface thereof to which the beam is irradiated.

Figure 3:
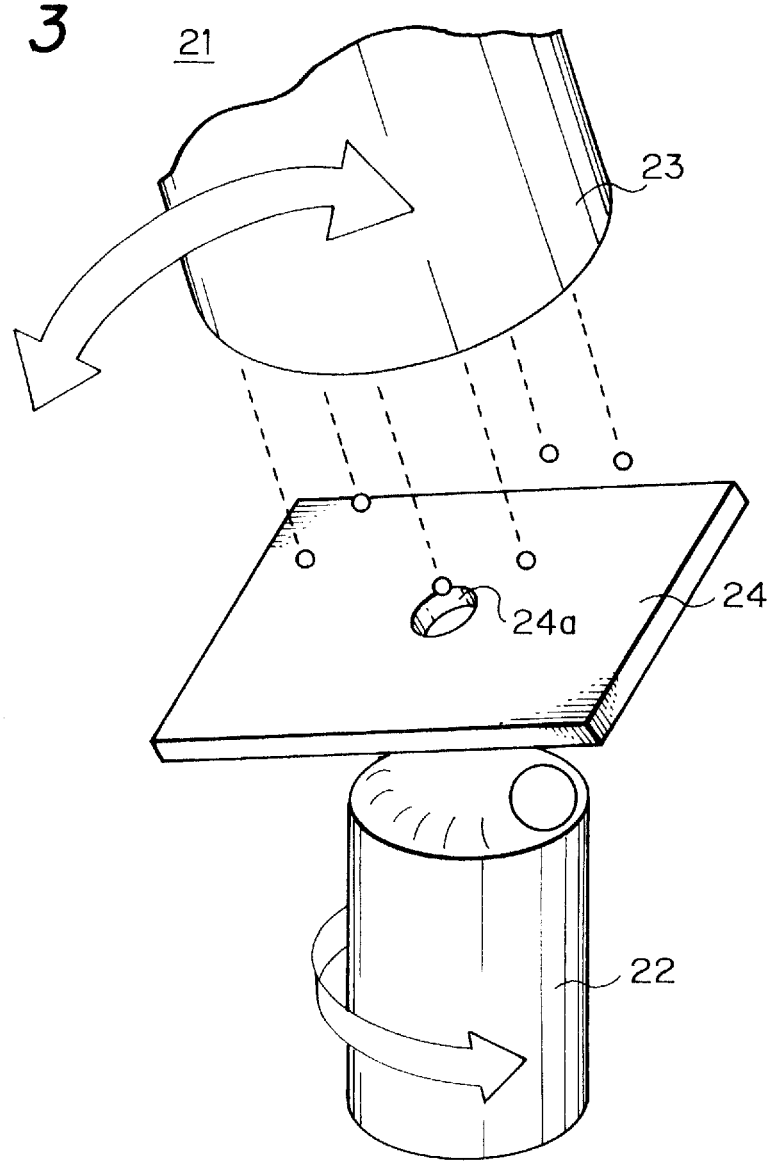
FIG. 3 is a schematic perspective view showing a second embodiment of the energy beam machining apparatus to which the energy beam machining method of the present invention is applied.
Figure 4:
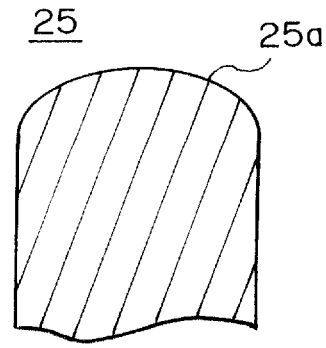
FIG. 4 is a longitudinal cross sectional view of a workpiece to explain a shape machined by the energy beam machining apparatus shown in FIG. 3.

An energy beam machining apparatus 21 shown in FIG. 3 is so arranged that an energy beam irradiation source 23 is swung or pivoted in synchronism with the rotation of a workpiece 22, and a swinging speed of the energy beam source 23 is so set that it is slower toward the right and left opposite ends of such movement and is quicker toward the center of such swinging movement. Further, the beam transmission hole 24a of a mask 24 is defined as a circular through hole in this embodiment, and a relative positional relationship among the energy beam source 23, the mask 24 and the workpiece 22 is so set that when the energy beam source 23 is located at the opposite ends of pivoting movement, the peripheral edge of the workpiece 22 is machined and when the energy beam source 23 is located at the center of the swinging operation, the central portion of the workpiece 22 is machined. As a result, the workpiece 22 is machined more deeply at the peripheral portion thereof as compared with the central portion thereof and a machined product 25 obtained finally has a convex surface 25a which is rounded from the central portion toward the peripheral portion in a semi-spherical shape as shown in FIG. 4.

Figure 5:
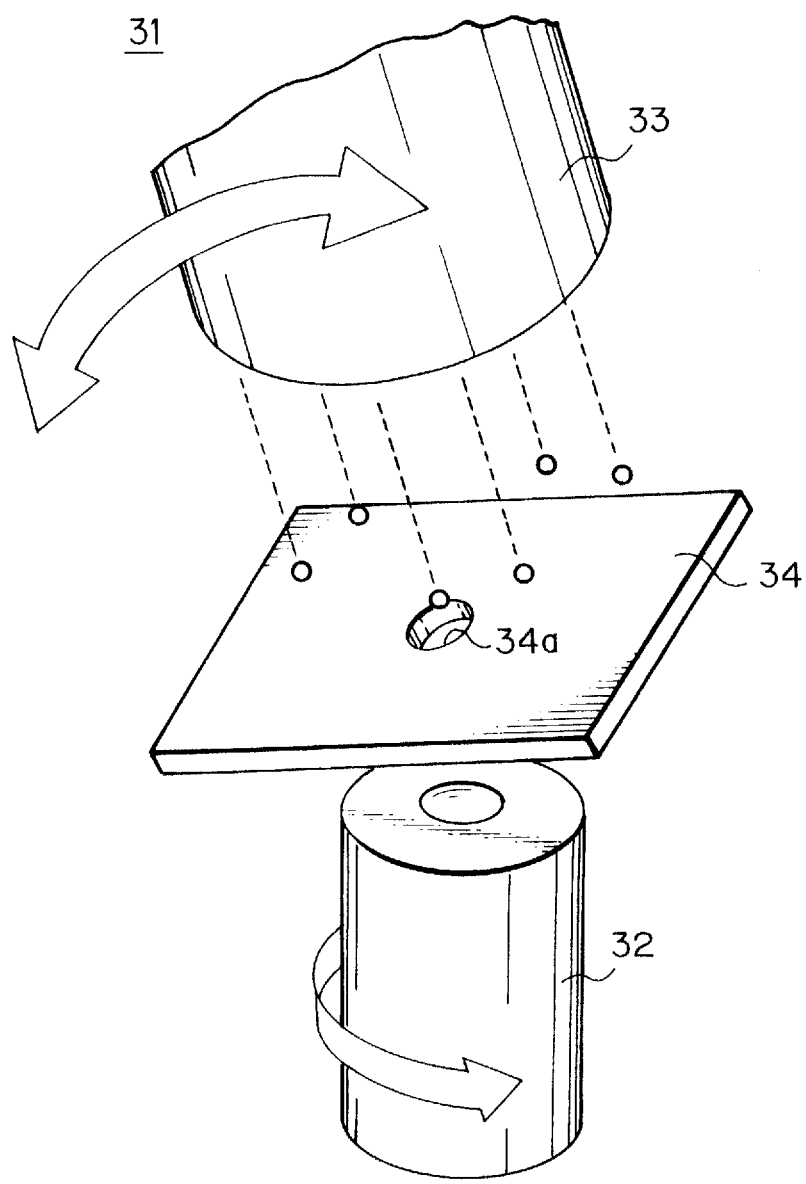
FIG. 5 is a schematic perspective view showing a third embodiment of the energy beam machining apparatus to which the energy beam machining method of the present invention is applied.
Figure 6:
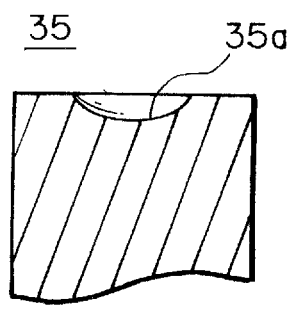
FIG. 6 is a longitudinal cross sectional view of a workpiece to explain a shape machined by the energy beam machining apparatus shown in FIG. 5.

Further, a swinging speed of the energy beam source in the above second embodiment may be so set that it is quicker toward the right and left opposite ends of swinging movement thereof and slower toward the center of the swinging movement. An energy beam machining apparatus 31 shown in FIG. 5 is arranged such that a swinging speed of an energy beam source 33 is reversely controlled as compared with that in the embodiment shown in FIG. 3, so that a swing range of the energy beam source 33 is narrower as compared with that of the above embodiment. In this embodiment, a positional relationship among the energy beam source 33, a mask 34 and a workpiece 32 is so set that when the energy beam source 33 is located at the opposite ends of swinging movement thereof, a radially intermediate portion of an end surface of the workpiece 32 is machined and when the energy beam source 33 is located at the center of the swinging movement, the central position of the workpiece 32 is machined. As a result, the workpiece 32 is machined more deeply at the central portion thereof as compared with the intermediate portion thereof in the radial direction and a machined product 35 obtained finally has a bowl-shaped hole or recess 35a which is deepest at the center thereof as shown in FIG. 6. Note, the mask 34 used in this embodiment has a beam transmission hole 34a opened in a circular shape similarly to the above embodiment.

Figure 7:
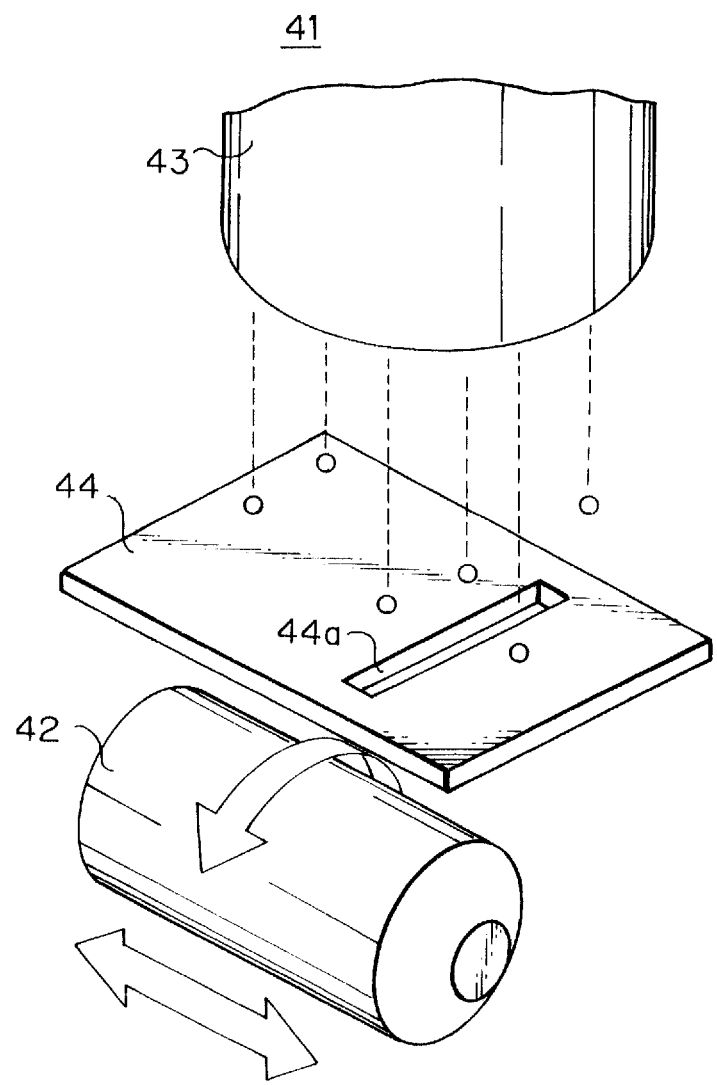
FIG. 7 is a schematic perspective view showing a fourth embodiment of the energy beam machining apparatus to which the energy beam machining method of the present invention is applied.
Figure 8:
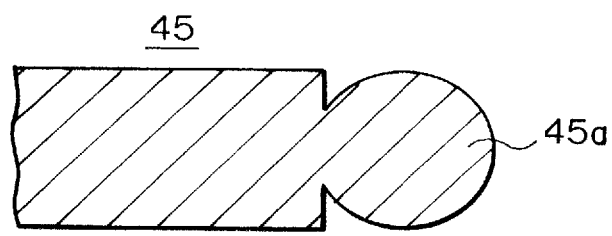
FIG. 8 is a longitudinal cross sectional view of a workpiece illustrating a shape machined by the energy beam machining apparatus shown in FIG. 7.

Further, different from the above first to third embodiments, it is possible that an energy beam source is fixed and the workpiece is rotated about its axis while it is reciprocatingly moved along its axial direction. An energy beam machining apparatus 41 shown in FIG. 7 is an apparatus for subjecting a columnar workpiece 42 to constricted shape machining to thereby form a spherically shaped product at the end of the workpiece. The workpiece 42 is rotated about its axis of rotation which is perpendicular to the direction in which a beam is irradiated from an energy beam source 43 and at the same time the workpiece 42 is reciprocatingly moved along the axis of rotation, that is, moved in parallel with a mask 44. The mask 44 has a rectangular slit defined therein which is perpendicular to the direction of the reciprocating movement of the workpiece 42 and serves as a beam transmission hole 44a. A beam passed through the slit-shaped beam transmission hole 44a is irradiated to the vicinity of the extreme end of the workpiece 42. In the case of the embodiment shown, since a speed of the reciprocating motion of the workpiece 42 is so controlled that it is slower toward the ends of the reciprocating motion and quicker toward the center of the reciprocating motion, a machining depth is maximized when an energy beam is irradiated at the ends of the reciprocating motion and it is minimized when the energy beam irradiates the center of the reciprocating motion. Therefore, a machined product 45 has a final shape formed as a spherical portion 45a as shown in FIG. 8.

Figure 9:
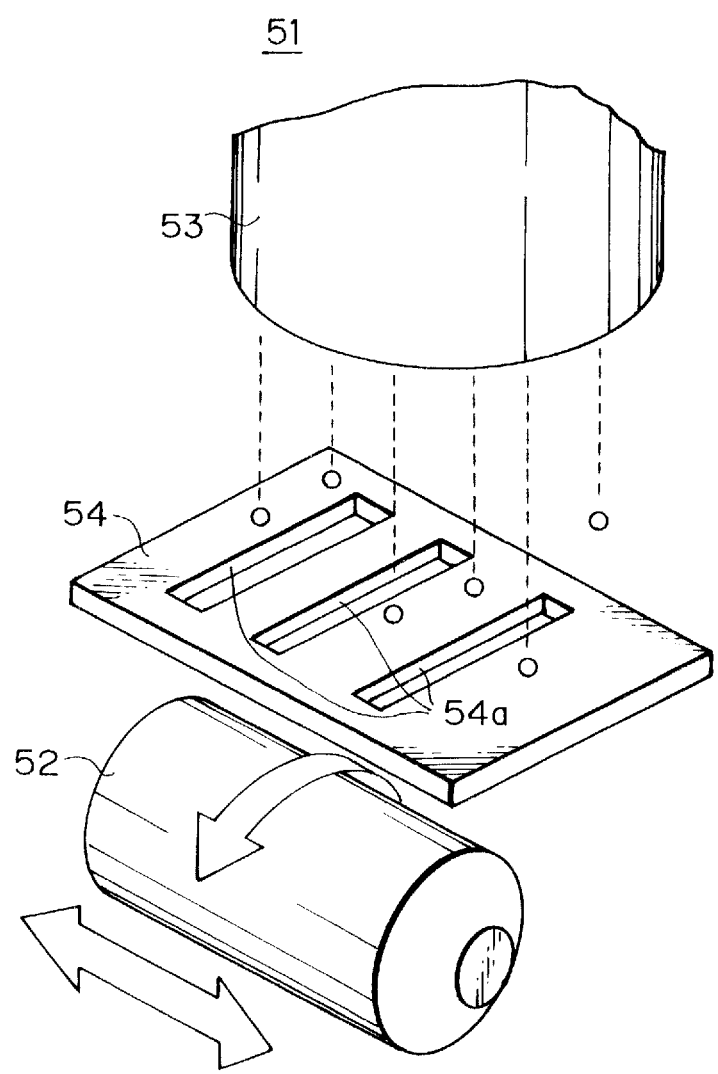
FIG. 9 is a schematic perspective view showing a fifth embodiment of the energy beam machining apparatus to which the energy beam machining method of the present invention is applied.
Figure 10:
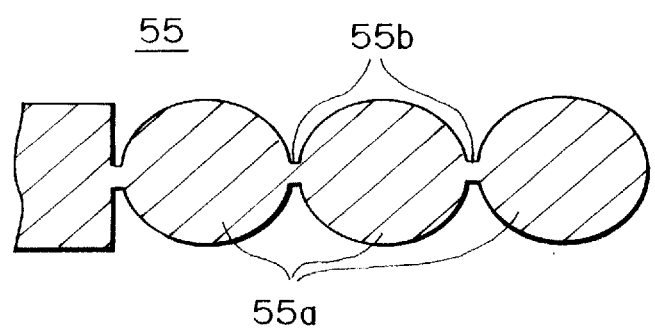
FIG. 10 is a longitudinal cross sectional view of a workpiece illustrating a shape machined by the energy beam machining apparatus shown in FIG. 9.
Figure 11:
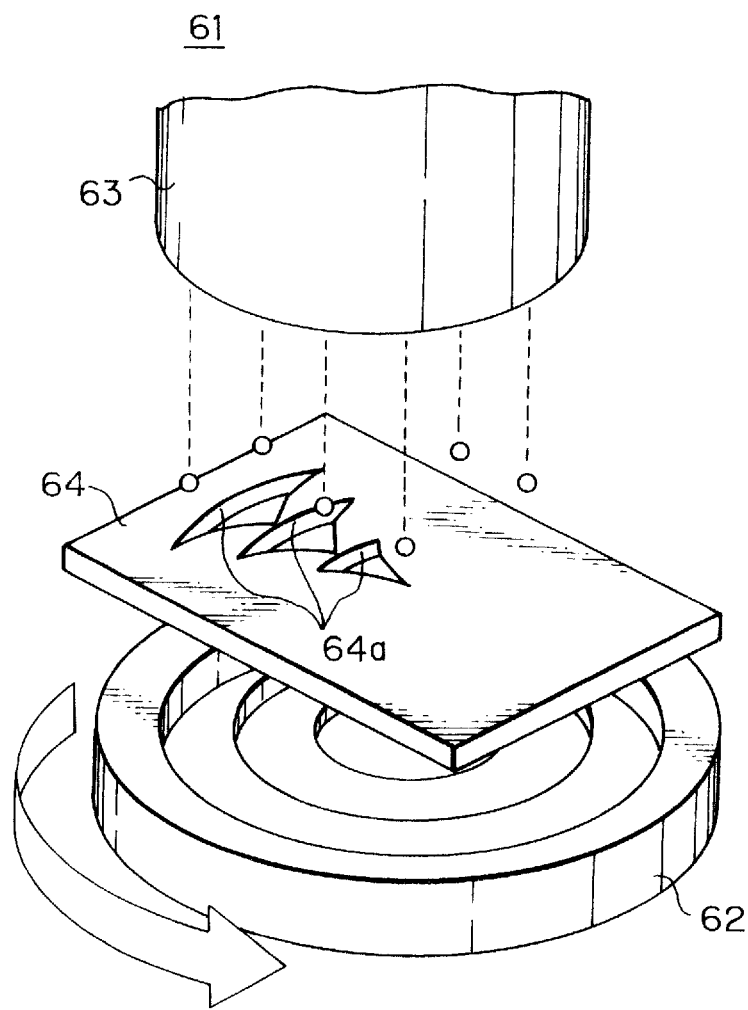
FIG. 11 is a schematic perspective view showing a sixth embodiment of the energy beam machining apparatus to which the energy beam machining method of the present invention is applied.

An energy beam machining apparatus 51 shown in FIG. 9 is obtained by modifying the above fourth embodiment. Although this energy beam machining apparatus 51 is the same as the above embodiment in that a workpiece 52 is rotated about its longitudinal axis and reciprocatingly moved along the axis while an energy beam source 53 is fixed, it is different from the above embodiment in that the number of slit-shaped beam transmission holes 54a defined in a mask 54 is not one but three, and the three slit-shaped beam transmission holes 54a are disposed in parallel with each other at equal intervals. In the case of this embodiment, since all of the three slit-shaped beam transmission holes 54a are covered by the irradiating range of the energy beam source 53, it is possible to form at the same time a machined product 55 having three spherical portions 55a connected each other through constricted portions 55b. As a result, when micro-spherical lenses are mass-produced, a glass material for lenses such as, for example, optical glass, quartz glass, ruby, sapphire, magnesium fluoride, ZnSe, ZnTe, GaAs, etc. is used, and the spherical portions 55a, i.e., micro-spherical lenses each having a size of 0.1 nm–100 nm can be effectively produced with a high accuracy by the suitable combination of the setting of a width of the slit-shaped beam transmission holes 54a and the control of a speed of reciprocating motion (parallel motion) of the workpiece 52. In particular, since a lens surface can be machined up to quantum level accuracy or visible ray level accuracy, when a homogeneous light beam is incident on the machined product 55 machined to the micro-spherical lens, a size of an effective portion where lens action is carried out can be made smaller than a wavelength of the homogeneous light beam.

Figure 12:
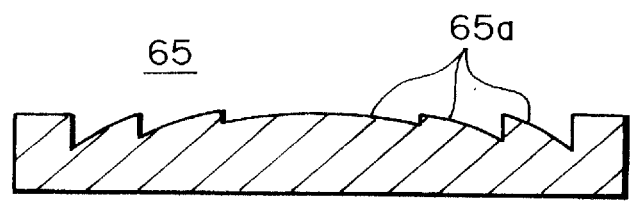
FIG. 12 is a longitudinal cross sectional view of a workpiece illustrating a shape machined by the energy beam machining apparatus shown in FIG. 11.

With respect to the energy beam machining apparatus 11 shown in the aforesaid first embodiment, a disc-shaped glass material can be machined to a Fresnel lens by increasing the number of the beam transmission holes 14a defined in the mask 14. More specifically, as in an energy beam machining apparatus 61 shown in FIG. 11, a mask 64 having three similar ginkgo-nut-shaped beam transmission holes 64a continuously formed therein is used as a mask covering a disc-shaped workpiece 62 and an energy beam is irradiated from an energy beam source 63 while the workpiece 62 is rotated about its axis of rotation passing through the inner most point of the smallest beam transmission hole 64a. In this case, since an open area of the beam transmission holes 64a is increased toward a direction spaced from the center axis of the irradiated beam and further each of beam transmission holes 64a is formed to the ginkgo nut shape, a finally obtained product 65 is a Fresnel lens having annular flat convex lens portions 65a concentrically formed on the surface of a disc-shaped glass material as shown in FIG. 12.

Note, in the above embodiments, a fast atomic beam, ion beam, electron beam, atomic/molecular beam and further radioactive beam and the like can be used as an energy beam. Since a fast atomic beam is a neutral high speed corpuscular beam, it can be applied to all the materials such as metals, semiconductors, insulating materials and the like, and the ion beam is effective for metal materials. When an electron beam is employed, a reactive gas is introduced to a workpiece simultaneously with the irradiation of the electron beam so that a chemical reaction is caused only at a portion where the electron beam is irradiated. Further, an atomic/molecular beam can be used as a low energy beam and machining can be effected using an atomic/molecular beam of a reactive gas. Further, a radioactive beam has a feature that the surface of a workpiece is machined by directly irradiating only with the radioactive beam, that machining is effected making use of the mutual reaction of the beam with reactive gas particles and that the beam is applicable to all the materials.

Further, as will be explained hereinafter, in the above embodiments, an operation of aligning a mask with a workpiece and a beam axis and an operation of for replacing the mask can be effected in a vacuum vessel. In this case, a machining process can be realized in which a workpiece is machined in a clean environment without being exposed to the atmosphere at all. This machining process provides a very high workability as a machining method which is particularly effective when there is a problem of oxidation and contamination on the surface of a workpiece. Further, when such a machining process is carried out in a vacuum, it is preferable to effect the alignment of a mask, workpiece and beam axis using a microscope such as an optical microscope, scanning type secondary electron microscope (SEM), laser microscope or the like, by which an energy beam source, the mask and the workpiece can be aligned with each other with ultra-high accuracy.

Figure 13:
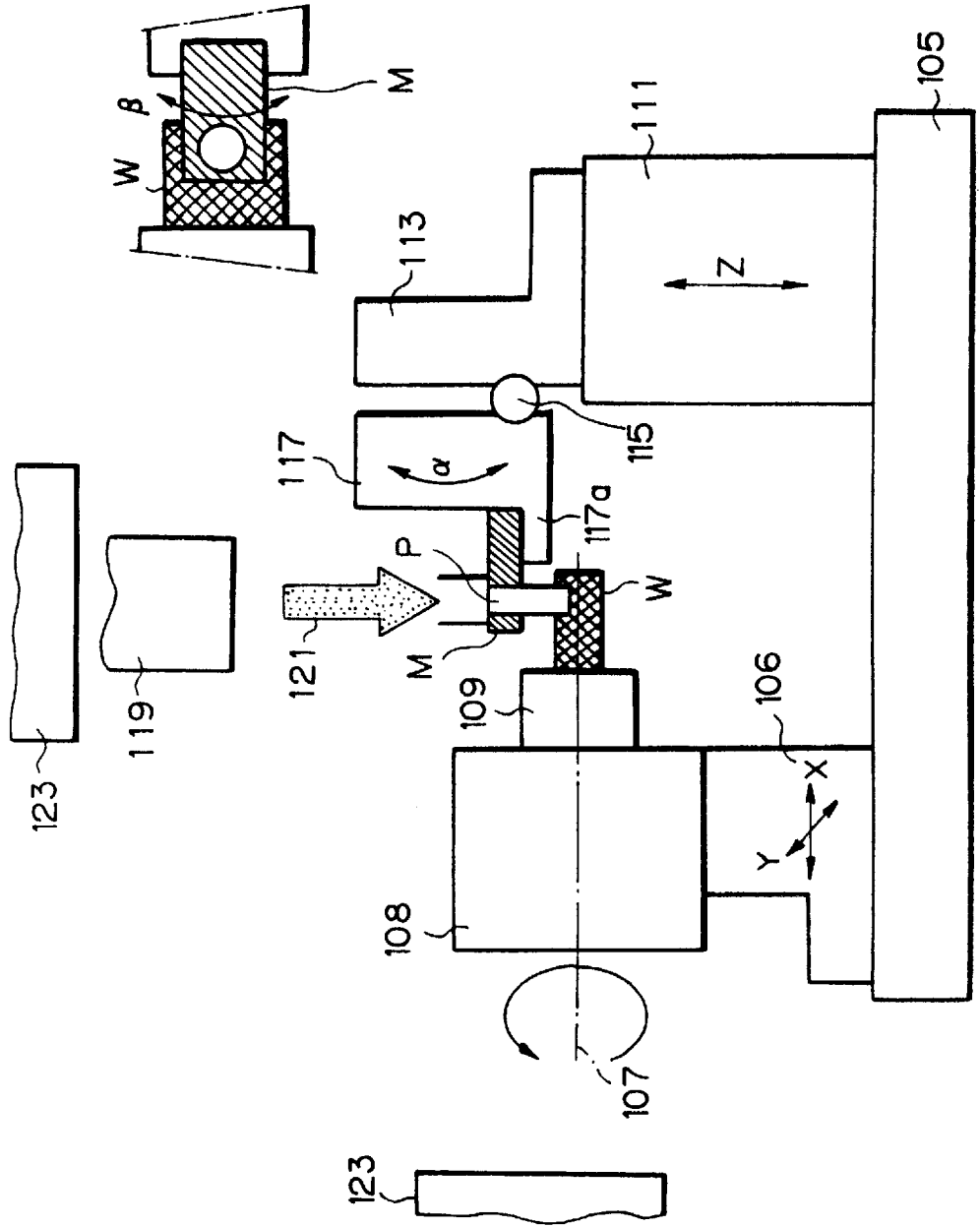
FIG. 13 is a schematic side elevational view showing an example of a positioning apparatus used in a method of the present invention.

FIGS. 13 and 13a show an embodiment of an apparatus embodying a method of the present invention, wherein an X-, Y-axes stage 106 movable in directions perpendicular to each other within a horizontal plane is disposed on a base 105, a θ-axis stage 108 rotatable about a spindle or an X-axis 107 is disposed on the X-, Y-axes stage 106, a workpiece W is detachably fixed to the θ-axis stage 108 through a fixture means 109, a Z-axis stage 111 movable in a Z-axis direction is disposed on the base 105, a β-axis stage 113 rotatable about the Z-axis is disposed on the Z-axis stage 11, an α-axis stage 117 rotatable about a Y-axis 115 is disposed on the β-axis stage 113, a mask M is detachably fixed on the α-axis stage 117, and an energy beam 121 is irradiated to the workpiece W from an energy beam source (e.g., a fast atomic beam source) 119 positioned above a mask M through a pattern hole p defined in the mask M. The X-, Y-axes stage 106 and the Z-axis stage 111 are fine movement stages having a positioning accuracy of 0.1 A to 10 μm and preferably 0.1 A–1 nm.

According to this positioning apparatus, the workpiece W can be finely moved both in the two directions, i.e., the X- and Y-axes by the X-, Y-axes stage 106, as well as rotated about its axis by the θ-axis stage 108. With this arrangement, the workpiece W can be machined by an energy beam while an arbitrary surface of the workpiece W about its axis is positioned relative to the mask M. Thus, with this arrangement, a machining method stated above referring to FIGS. 7, 8, 9 and 10 can be effected. Further, a distance (in the Z-axis direction) of the mask M to the workpiece W can be finely adjusted by the Z-axis stage 111 and an inclination of the mask M in a horizontal plane and the parallelism of the mask M with the workpiece W can be adjusted with high accuracy by the β-axis stage 113 and the α-axis stage 117 (α, β rotational angles). With this arrangement, a distance of the workpiece W to the mask M, parallelism of the workpiece W relative to the mask M and a relative position thereof in a parallel plane can be finely adjusted.

Note, a distance of a machining surface of the workpiece W to the mask M is usually set from an intimate contact state to about 1 mm. In addition, the mask M may be a preformed one such as, for example, a nickel foil patterned by electro-casting and having a thickness of a few micrometers. The nickel foil can be fixed to mask mounting portion 117a of the α-axis stage 117 using an adhesive tape having good flatness. Incidentally, the workpiece W may be positioned relative to the mask M while they are observed through an optical microscope 123 and their positioning can be remotely controlled while observing an image display unit which shows the movement of the workpiece and the mask. In this case, by observing the workpiece W and the mask M from more than one direction, it is possible to observe the parallelism between them. For this purpose, the energy beam source 119 and the optical microscope 123 can be advanced to and retracted from a machining position and an observing position by a not shown guide. With this arrangement, machining can be carried out in such a manner that the mask M is set at a desired position relative to an arbitrary machining surface of the work piece W.

Figure 14:
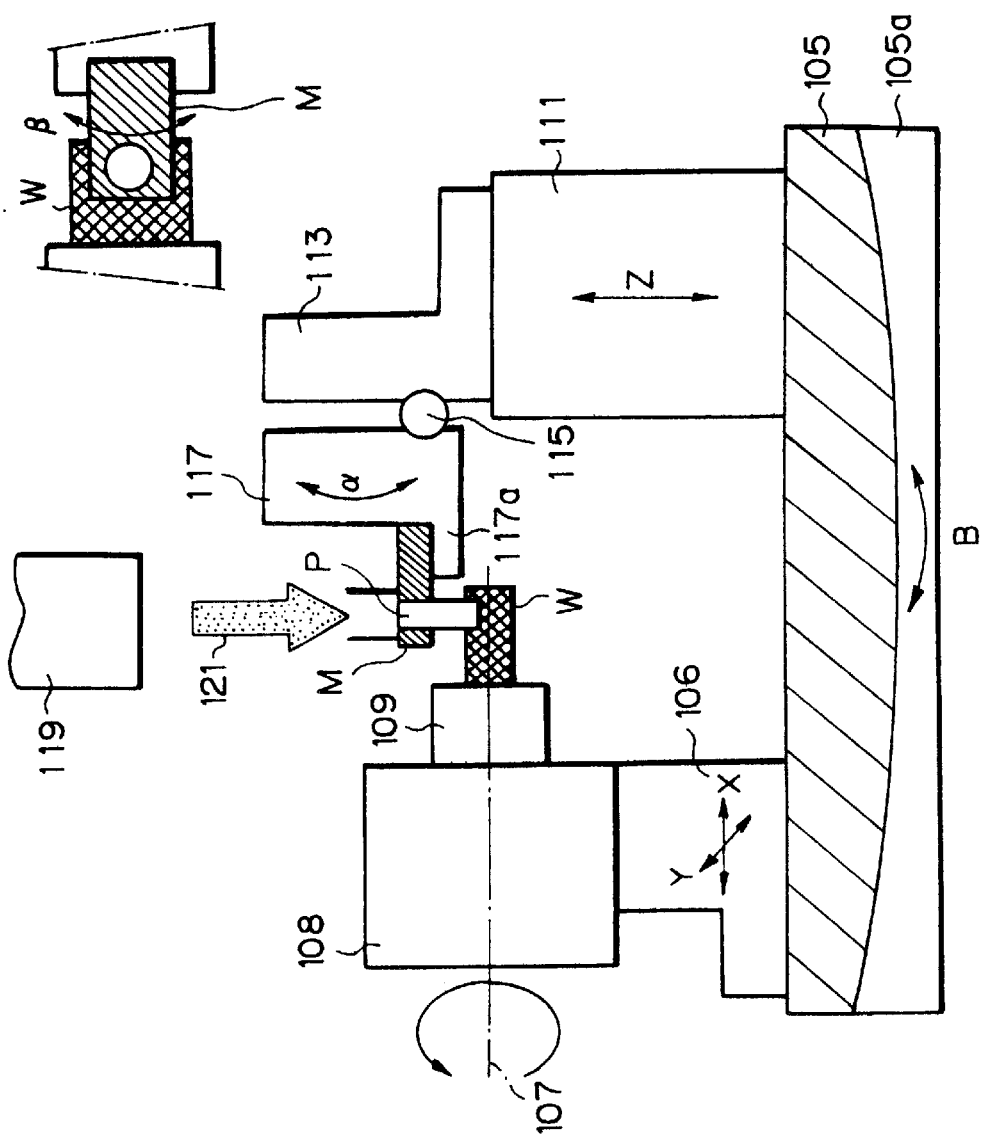
FIG. 14 is a schematic side elevational view showing another example of an apparatus used in a method of the present invention.

FIGS. 14 and 14a show another embodiment of the apparatus for carrying out the method of the invention. The apparatus shown is similar to that of FIGS. 13 and 13a, but in this embodiment, the lower surface of the base 105 is spherically rounded and the overall apparatus may be swung about one or more axes on a base guide 105a as shown by an arrow B in FIG. 14. Thus, the workpiece W may be rotated about an axis which is oblique to a direction in which the energy beam is irradiated.

Figure 15:
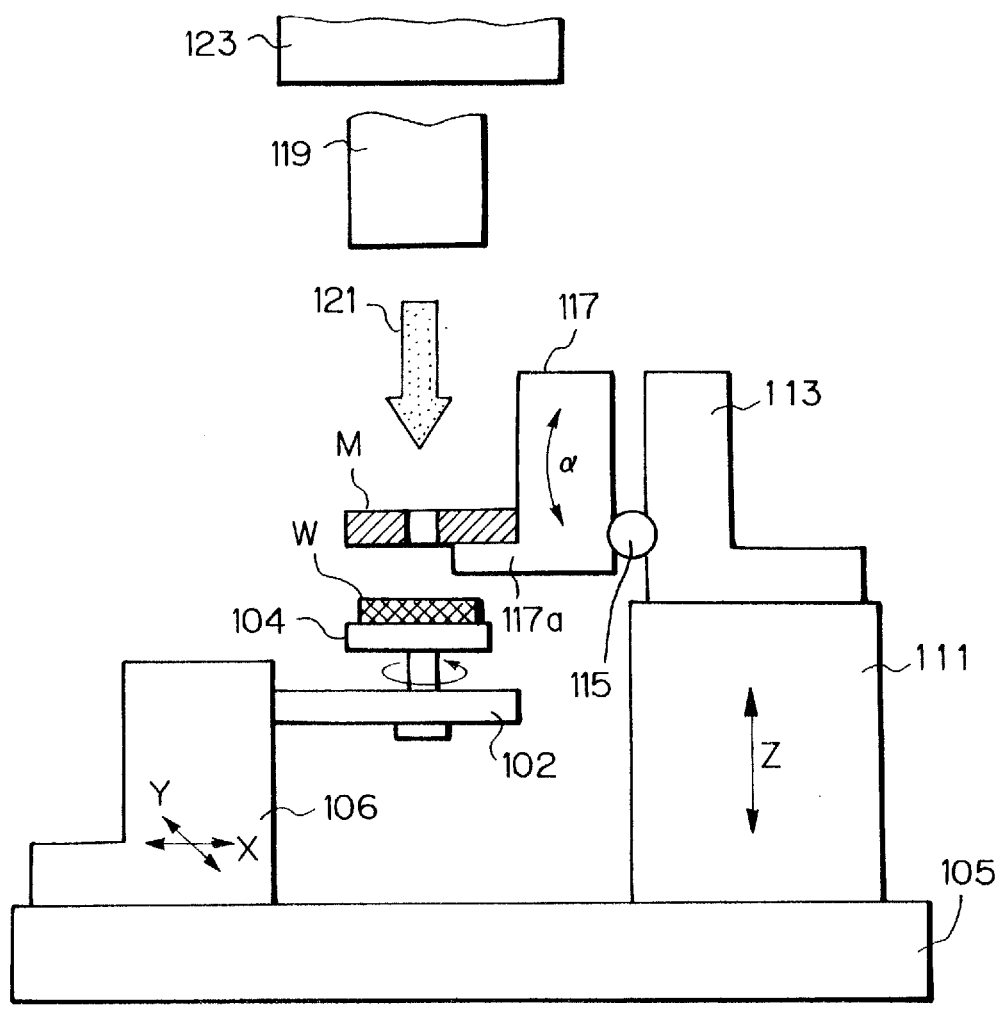
FIG. 15 is a schematic side elevational view showing a further example of an apparatus used in a method of the present invention.

FIG. 15 shows a further embodiment of the apparatus used in a machining method of the invention, wherein a support 102 is fixed to the X-, Y-axes stage 106, a turntable 104 is provided on the support 102 so that it is rotatable about an axis along a direction in which the energy beam 121 is irradiated, and the workpiece W is detachably attached on the turntable 102 by means of an adhesive tape or the like. The remaining arrangement of the apparatus is the same as those of the apparatus shown in FIG. 13a. With this arrangement, a machining method stated above referring to FIGS. 1, 2, 11 and 12 can be effected.

Figure 16:
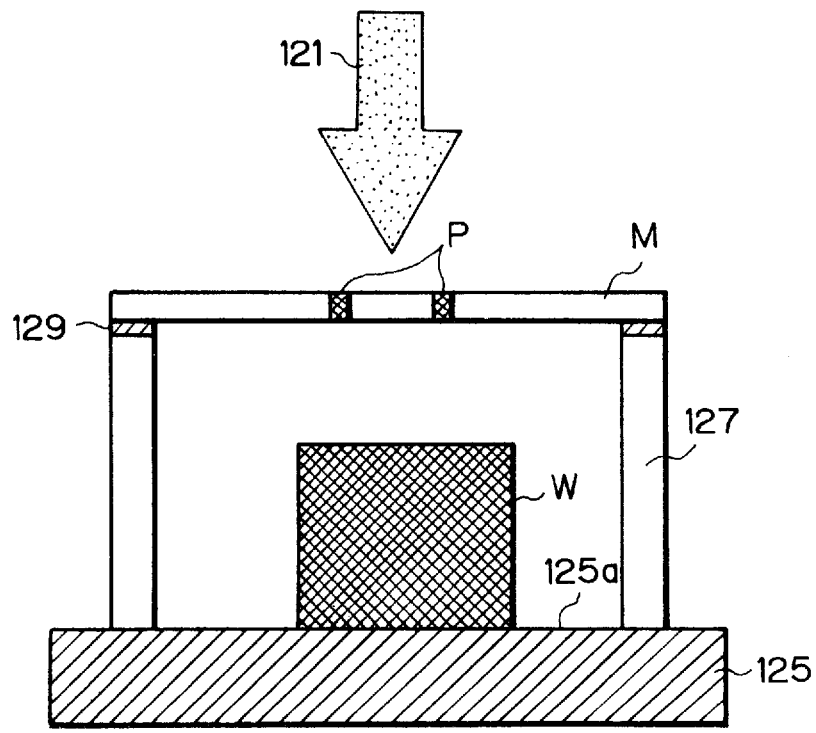
FIG. 16 is a schematic side elevational view showing an example of a fixture used in another method of the present invention.

FIG. 16 shows another method of the present invention, in which a workpiece is machined in such a state that it is fixed by a fixture to have a predetermined positional relationship relative to the mask. For this purpose, the workpiece W is fixed on a flat fixing table 125 by an adhesive tape having good flatness, bolts, screws or the like and the mask M is disposed above the workpiece W through a spacer 127. The spacer 127 stands on the fixing table 125 and the mask M is mounted on the spacer 127 using an adhesive tape having good flatness, bolts, screws or the like 129 (adhesive tape is used in FIG. 16).

Figure 20:
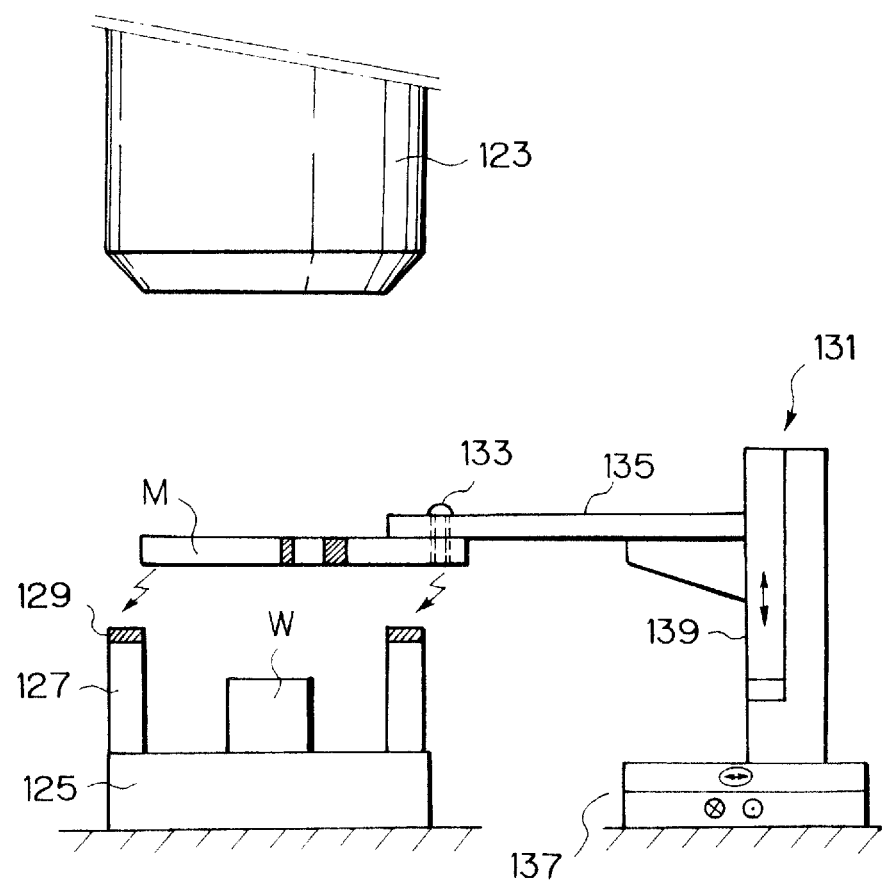
FIG. 20 is a schematic side elevational view showing an example of a positioning apparatus used in the fixture shown in FIG. 16.

As shown in FIG. 20, the mask M is positioned relative to the workpiece W in such a manner that the mask M is positioned relative to the fixing table 125 on which the workpiece W is positioned by a positioning apparatus 131 while the mask M is observed by an optical microscope 123. The mask M is fixed on the spacer 127. Although an optical microscope having a long focusing depth is used as the optical microscope 123, a laser microscope may be used in place of the optical microscope. The mask M is fixed to support arm 135 of the positioning apparatus 131 by bolts, an adhesive tape or the like (screws 133 are used in FIG. 20). The positioning apparatus 131 can control the fine movement of the mask M in the directions of three axes X, Y and Z which are perpendicular to each other by an X-, Y-axes stage 137 and a Z-axis stage 139. Note, a plurality of optical microscopes and/or a plurality of laser microscopes may be used to effect alignment in X-, Y-axes directions and a Z-axis direction with a high accuracy. Note, although not shown, inclinations of the workpiece and the mask in a horizontal plane may be adjusted by mounting a β-axis stage rotatable about the Z-axis to the positioning apparatus 131. As shown in FIG. 16, on the completion of the positioning of the mask M relative to the workpiece W, the mask M is separated from the positioning apparatus 131 and the optical microscope 123 and the positioning apparatus 131 are retracted from the workpiece W and the mask M. Then, a fast atomic beam source (not shown) is positioned at a machining position above the thus positioned workpiece and mask and machining is carried out.

Figure 17:
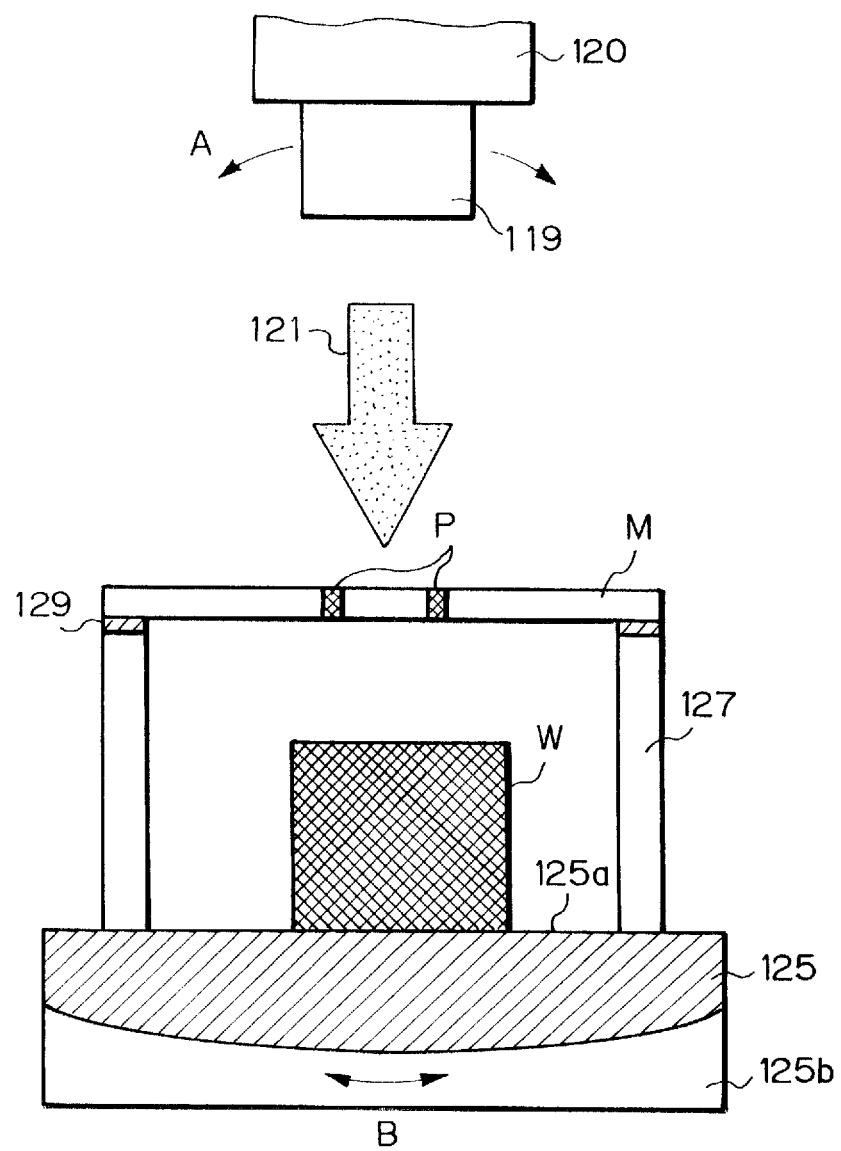
FIG. 17 is a view showing a relative movement between the energy beam and the mask in the method using the fixture shown in FIG. 16.

Although, in the embodiment shown in FIG. 16, the relative positional relationship between the energy beam 121 and the mask M is fixed, they can be moved relative to each other by providing the energy beam source 119 on a manipulator 120 so that it is swingable about one or more axes as shown in FIG. 17, or by providing a spherical surface on the lower surface of the stage 125 and swinging the overall apparatus about one or more axes so that it slides on a stage guide 125b as shown by an arrow B in FIG. 17.

Figure 18:
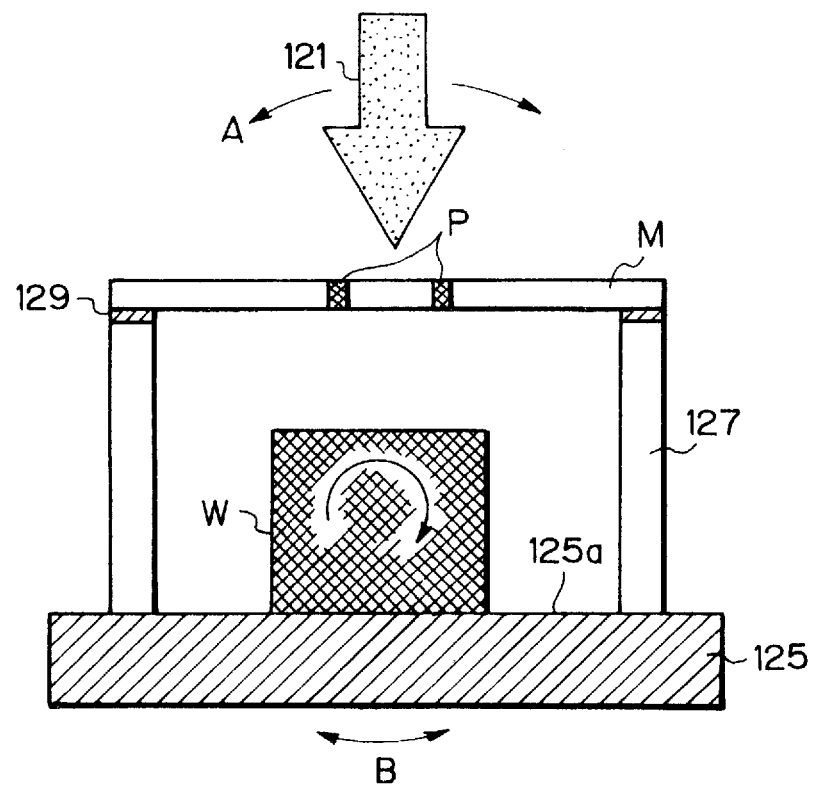
FIG. 18 is a schematic side elevational view showing another example of the fixture.

In addition, although FIG. 16 shows an example in which a cube-shaped workpiece W having a machining surface which is parallel with the workpiece setting surface 125a of the fixing table 125 and the mask M is machined, a fixture including a spacer provided with a micrometer head (not shown) may be adopted to more accurately establish parallelism of the mask with the machining surface of the workpiece. Further, as shown in FIG. 18, three-dimensional machining may be carried out by machining an arbitrary machining surface faced to the mask by rotating the workpiece W on the workpiece setting surface 125a of the fixing table 125. In this case, a position where the workpiece is to be disposed is marked on the workpiece setting surface and the workpiece is positioned in accordance with the mark. Therefore, an adhesive tape is not always necessary.

Figure 19:
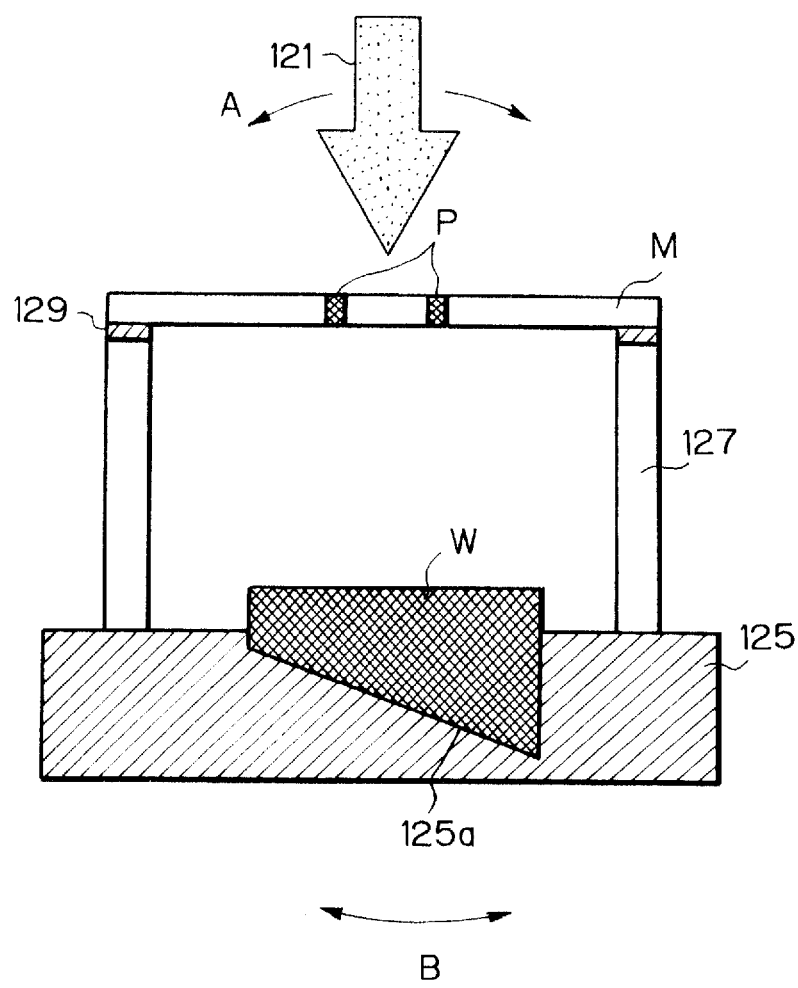
FIG. 19 is a schematic side elevational view showing still another example of the fixture.

FIG. 19 shows that a shape of the workpiece setting surface 125a of the fixing table 125 may be suitably selected in accordance with a shape of a workpiece so that a machining surface of the workpiece can be set parallel with or at an arbitrary angle to the mask when the work piece W has a complex shape.

In the embodiments shown in FIGS. 18 and 19 either, like the fixture shown in FIG. 17, the energy beam source may be swung by a manipulator or the fixing table 125 may be swung on a table guide as shown by arrows A and B respectively, to thereby allow a relative movement between the energy beam 121 and the mask M.

Figure 21:
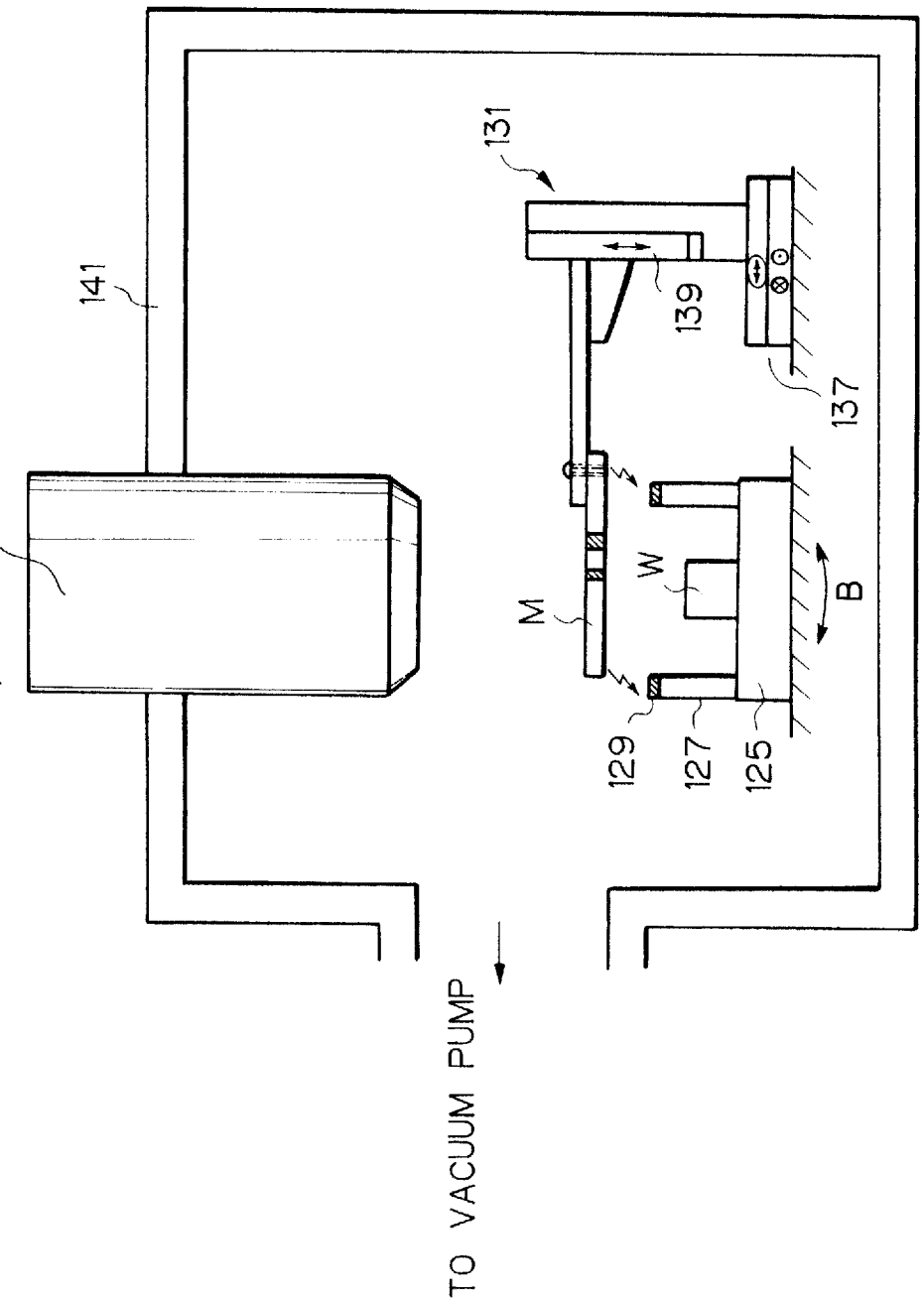
FIG. 21 is a schematic side elevational view showing an example of an apparatus used in still another method of the present invention.

FIG. 21 shows a further embodiment of the invention, wherein the positioning apparatus 131 of FIG. 20 is disposed in a vacuum vessel 141, the vacuum vessel 141 is evacuated to high vacuum by a vacuum pump and the workpiece W is positioned relative to the mask M from the outside of the vacuum vessel 141. When the positioning is carried out in a vacuum as described above, since the workpiece W and the mask M need not be exposed to the atmosphere, the positioning process can be instantly followed by a subsequent machining process which is carried out by an energy beam. Thus, not only can an operating time be shortened but also positional dislocation among the workpiece, the mask and associated devices does not arise, which would otherwise be caused by changing the position between the positioning and machining operations. Further, since a problem of oxidation of the surface of the workpiece does not arise, machining can be carried out with high accuracy. Note, on the completion of positioning, an optical microscope is removed from an observing position and an energy beam source is moved to a machining position also in this embodiment.

Figure 22:
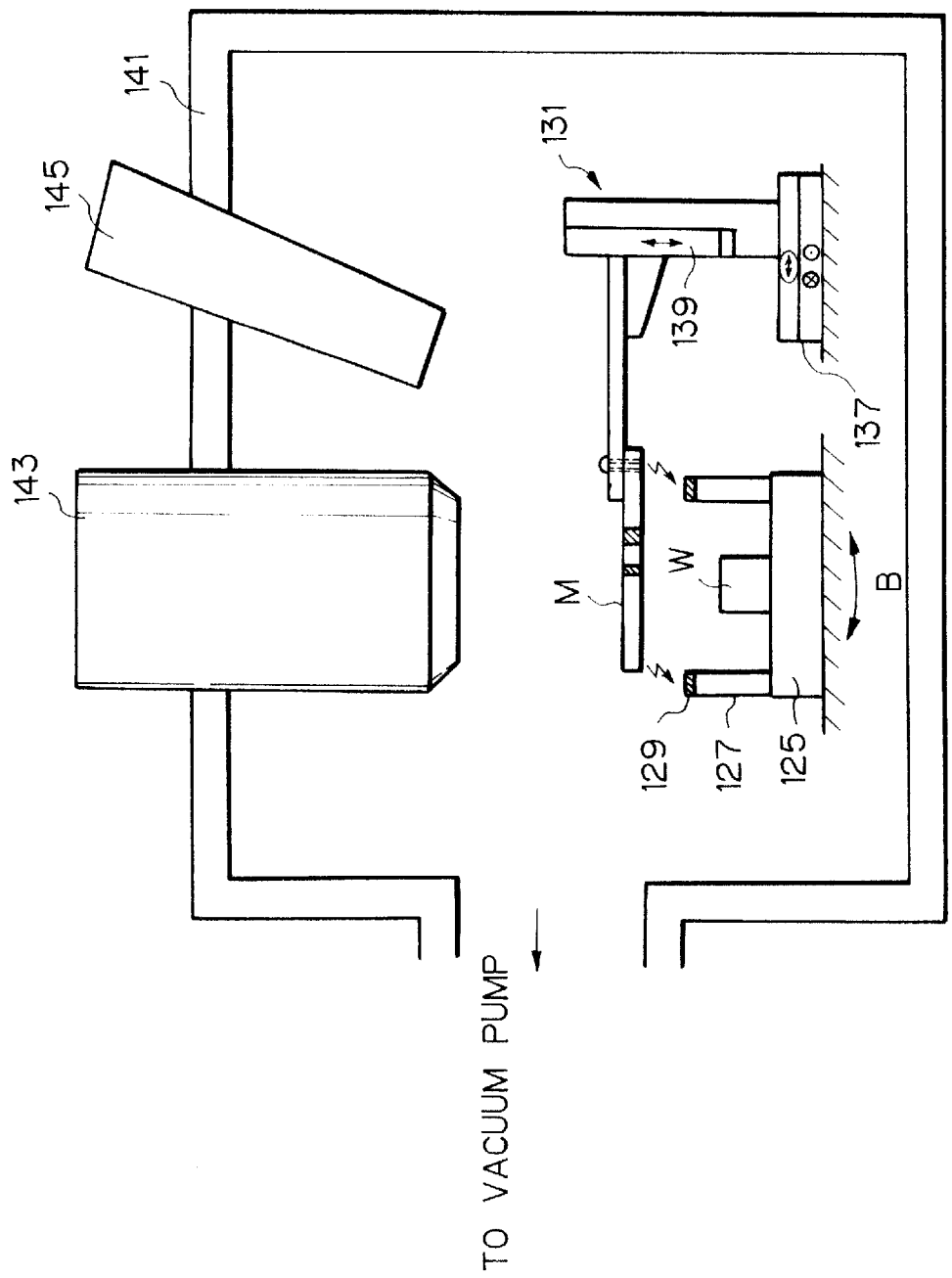
FIG. 22 is a schematic side elevational view showing another example of an apparatus used in still another method of the present invention.
Figure 25:
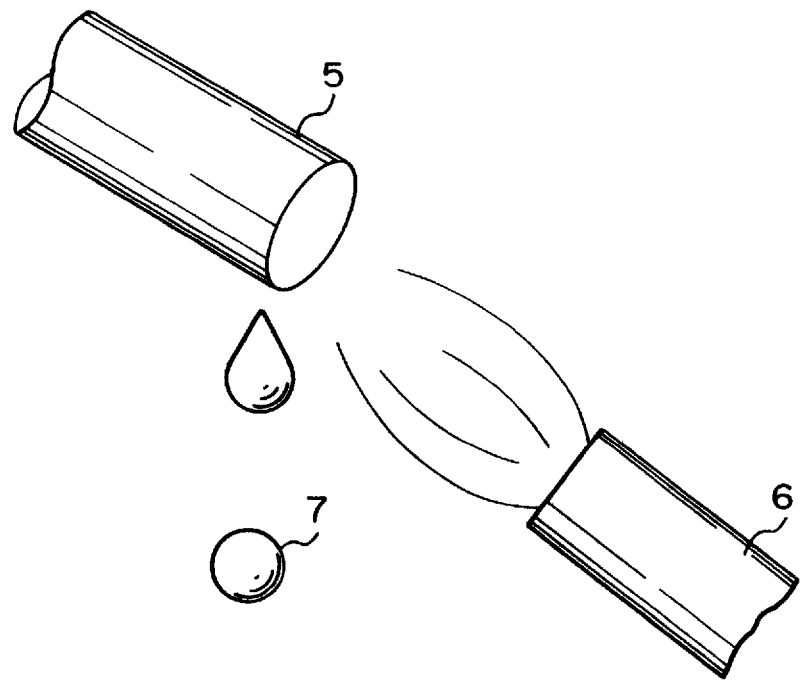
FIG. 25 is a schematic perspective view showing an example of a conventional method of manufacturing a micro-spherical lens.
Figure 26:
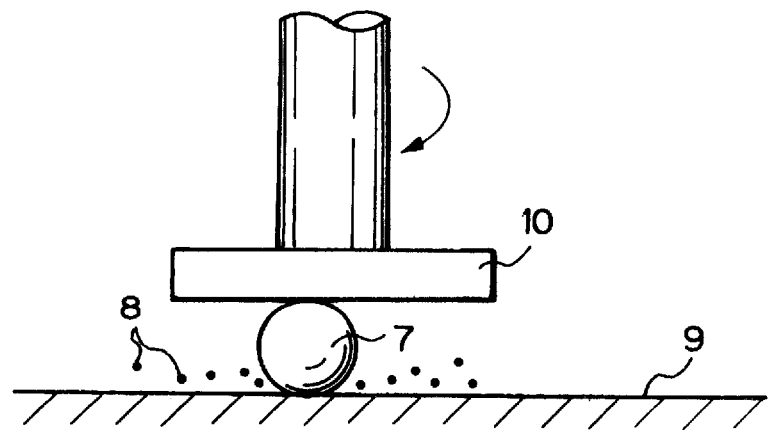
FIG. 26 is a schematic side elevational view showing an example of a conventional method of polishing a micro-spherical lens.

FIG. 22 shows an embodiment wherein the workpiece W can be observed and positioned relative to the mask M with a higher magnification power when a scanning type electron microscope (SEM) 143 and a secondary electronic collector 145 are used in place of the optical microscope 123 in the method of FIG. 21. Incidentally, a beam source which generates secondary electrons by irradiating a beam such as an ion beam or laser beam to a workpiece may be used in place of the above scanning type electron microscope.

FIG. 23 shows a further embodiment of the invention, wherein the positioning apparatus of FIG. 14 is disposed in a vacuum vessel 141, the vacuum vessel 141 is evacuated to high vacuum by a vacuum pump and the workpiece W is positioned relative to the mask M and control of the machining is achieved from the outside of the vacuum vessel 141. To this end, the movement of each moving part of the apparatus, such as the base 105, the X-, Y-axes stage 106, the θ-axis stage 108, the Z-axis stage 111, the β-axis stage 113, the α-axis stage 117, the manipulator 120 and so on is controlled by a controller 147 and the controller 147 is controlled by a memory 148 and a CPU unit 149 so that a desired pattern is machined on the workpiece W through the computerized movement of the respective parts. When the positioning and the machining operations are carried out in vacuum as described above, since the workpiece W and the mask M need not be exposed to the atmosphere, advantageous effects similar to those given in the embodiment shown in FIGS. 21 and 22 can be obtained.

As described above, according to the present invention, an energy beam is irradiated to a workpiece through the beam transmission hole(s) defined in the mask, and at this time, a relative position between the energy beam source and the mask or between the mask and the workpiece is changed so that the machining depth of the workpiece is varied depending on machining portions of the workpiece, which corresponds to an amount of irradiation of the energy beam. Thus, there is achieved excellent advantages that a machined product having locally different depths, especially a microproduct, easily can be made and further the product can be made with high accuracy by a single machining operation in a short time. This is quite different from a conventional lithography technology for forming the surface of a substrate having three-dimensional irregularities by repeating processes such as the coating of a resin, exposure, development and the like.

In addition, since the positioning of the workpiece and the mask is effected by means of a fine positioning apparatus while observing the relative positional relationship therebetween by a microscope, and machining can be carried out while holding the workpiece and the mask on the fine positioning apparatus or holding them in a fixture, it is possible to effect machining with high accuracy and rapidly.

Further, since the energy beam source, the mask and the workpiece may be aligned with each other in vacuum by using a microscope such as an optical microscope, a scanning type secondary electron microscope (SEM), a laser microscope or the like, all operations such as an operation of alignment of the mask, the workpiece and a beam axis and an operation of replacing the mask can be effected in the vacuum vessel. This results in a machining process in which a workpiece is machined in a clean environment without being exposed to the atmosphere at all, so that very high workability can be obtained for a machining method which is particularly effective when there is a problem of oxidation and contamination on the surface of the workpiece.

What is claimed is:

1. A method of machining a pattern in a workpiece, said method comprising:

emitting an energy beam from an energy beam source;

passing a portion of said energy beam through a beam transmission hole of a predetermined shape defined in a mask, to thereby form a shaped energy beam having a shape corresponding to said predetermined shape;

irradiating said shaped energy beam onto said workpiece and thereby machining said workpiece; and changing at least one of a relative positional relationship between said energy beam source and said mask and a relative positional relationship between said mask and said workpiece, and thereby machining said pattern into said workpiece while changing an amount of irradiation of said shaped energy beam onto different portions of said workpiece and thus controlling the depth of machining thereof.

2. A method as claimed in claim 1, wherein said changing comprises rotating one of said mask and said workpiece about an axis extending parallel to said energy beam, and an open area of said beam transmission hole increases radially outwardly of said axis.

3. A method as claimed in claim 1, wherein said changing comprises swinging said energy beam source through a swing cycle while regularly changing the speed of said swinging, and rotating said workpiece about an axis that extends parallel to said energy beam when said energy beam source is in a center of said swing cycle.

4. A method as claimed in claim 1, wherein said changing comprises rotating said workpiece about an axis that is perpendicular or oblique to said energy beam, and creating relative movement between said mask and said workpiece while maintaining said mask and said workpiece parallel to each other and while regularly changing the speed of said relative movement as a function of a relative positional relationship therebetween.

5. A method as claimed in claim 1, further comprising aligning said energy beam source, said mask and said workpiece in a vacuum by use of a microscope.

6. A method as claimed in claim 1, comprising determining said relative positional relationship between said mask and said workpiece by use of a fine positioning apparatus while observing said mask and said workpiece through a microscope.

7. A method as claimed in claim 6, comprising conducting said determining while observing said mask and said workpiece through said microscope from a plurality of directions.

8. A method as claimed in claim 6, comprising conducting said machining while supporting said mask and said workpiece on said fine positioning apparatus.

9. A method as claimed in claim 6, comprising maintaining a relative spacing between said mask and said workpiece at a distance in a range of from intimate contact therebetween to about 1 mm.

10. A method as claimed in claim 6, comprising controlling a spacing between a surface of said workpiece to be machined and said mask, a degree of parallelism between said workpiece and said mask and a relative position between said workpiece and said mask in parallel planes in said fine positioning apparatus.

11. A method as claimed in claim 6, comprising conducting said determining at an accuracy of from 0.1 Å to 1 nm.

12. A method as claimed in claim 6, comprising conducting said determining at an accuracy of from 0.1 Å to 10 $\mu$m.

13. A method as claimed in claim 6, wherein said microscope comprises an optical microscope, a laser microscope, a reflective electron microscope or a secondary electron microscope.

14. A method as claimed in claim 6, wherein said microscope comprises a scanning type electron microscope.

15. A method as claimed in claim 6, wherein said fine positioning apparatus is positioned in a vacuum vessel, and comprising controlling said fine positioning apparatus from outside said vacuum vessel.

16. A method as claimed in claim 1, wherein said energy beam comprises a fast atomic beam, an ion beam, an atomic/molecular beam, a laser beam or a radioactive beam.

17. A method as claimed in claim 1, wherein said workpiece comprises a glass material to be machined into a lens.

18. A method as claimed in claim 17, wherein said glass material comprises optical glass, quartz glass, ruby, sapphire, magnesium fluoride, ZnSe, ZnTe, or GaAs.

19. A method as claimed in claim 17, wherein said workpiece is formed by said machining into a micro-spherical lens or a Fresnel lens.

20. A method as claimed in claim 17, wherein said micro-spherical lens has an operable portion having a size of 0.1 nm to 10 nm, 10 nm to 1 $\mu$m or 1 $\mu$m to 100 $\mu$m.

21. A method as claimed in claim 17, wherein said micro-spherical lens has an operable portion having a size equal to or less than a wavelength of a homogenous incident light beam.

22. A method as claimed in claim 1, wherein said workpiece is formed by said machining into a semiconductor device.

23. An apparatus for machining a pattern in a workpiece, said apparatus comprising:

an energy beam source for emitting an energy beam;

a mask positioned between said energy beam source and the workpiece to be machined and toward which said energy beam is directed, said mask having a beam transmission hole of a predetermined shape for forming a shaped energy beam of said predetermined shape, such that said shaped beam is irradiated onto the workpiece to thereby machine the workpiece; and control means for changing at least one of a relative positional relationship between said energy beam source and said mask and a relative positional relationship between said mask and the workpiece, and thereby machining said pattern into the workpiece while changing an amount of irradiation of said shaped energy beam onto different portions of the workpiece and thus controlling the depth of machining thereof.

24. An apparatus as claimed in claim 23, wherein said control means includes means for changing said relative positional relationship between said energy beam source and said mask, and further comprising a microscope for observing said relative positional relationship between the workpiece and said mask, and a fine positioning apparatus for determining said relative positional relationship between the workpiece and said mask.

25. An apparatus as claimed in claim 24, further comprising a fixture for maintaining said relative positional relationship between the workpiece and said mask as determined by said fine positioning apparatus.

26. An apparatus as claimed in claim 23, wherein said control means includes means for rotating one of said mask and the workpiece about an axis extending parallel to said energy beam, and an open area of said beam transmission hole increases radially outwardly of said axis.

27. An apparatus as claimed in claim 23, wherein said control means includes means for swinging said energy beam source through a swing cycle while regularly changing the speed of said swinging, and means for rotating the workpiece about an axis that extends parallel to said energy beam when said energy beam source is in a center of said swing cycle.

28. An apparatus as claimed in claim 23, wherein said control means includes means for rotating the workpiece about an axis that is perpendicular or oblique to said energy beam, and means for creating relative movement between said mask and the workpiece while maintaining said mask and the workpiece parallel to each other and while regularly changing the speed of said relative movement as a function of a relative positional relationship therebetween.

29. An apparatus as claimed in claim 23, further comprising means for aligning said energy beam source, said mask and the workpiece in a vacuum by use of a microscope.

30. An apparatus as claimed in claim 23, further comprising a fine positioning apparatus for determining said relative positional relationship between said mask and the workpiece, and a microscope for observing said mask and said workpiece.

31. An apparatus as claimed in claim 30, wherein said microscope comprises an optical microscope, a laser microscope, a reflective electron microscope or a secondary electron microscope.

32. An apparatus as claimed in claim 30, wherein said microscope comprises a scanning type electron microscope.

33. An apparatus as claimed in claim 30, wherein said fine positioning apparatus is positioned in a vacuum vessel, and comprising means for controlling said fine positioning apparatus from outside said vacuum vessel.

34. An apparatus as claimed in claim 23, wherein said energy beam source comprises means for generating a fast atomic beam, an ion beam, an atomic/molecular beam, a laser beam or a radioactive beam.

* * * * *